(12) United States Patent
Echizen et al.

(10) Patent No.: US 6,740,210 B2
(45) Date of Patent: May 25, 2004

(54) SPUTTERING METHOD FOR FORMING FILM AND APPARATUS THEREFOR

(75) Inventors: Hiroshi Echizen, Nara (JP); Toshihiro Yamashita, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 132 days.

(21) Appl. No.: 09/973,713

(22) Filed: Oct. 11, 2001

(65) Prior Publication Data

US 2002/0046943 A1 Apr. 25, 2002

(30) Foreign Application Priority Data

Oct. 23, 2000 (JP) ........................... 2000-323176

(51) Int. Cl.[7] ............................................. C23C 14/34
(52) U.S. Cl. ......................... 204/192.13; 204/298.03; 204/298.09; 204/298.23; 204/298.24
(58) Field of Search ................. 204/192.1, 192.13, 204/298.03, 298.23, 298.24, 298.26, 298.09

(56) References Cited

U.S. PATENT DOCUMENTS

| 4,331,526 A | * | 5/1982 | Kuehnle | 204/192 R |
| 4,356,073 A | | 10/1982 | McKelvey | 204/192 |
| 4,422,916 A | | 12/1983 | McKelvey | 204/192 |
| 5,571,749 A | * | 11/1996 | Matsuda et al. | 437/113 |
| 6,051,851 A | | 4/2000 | Ohmi et al. | 257/185 |
| 6,054,024 A | | 4/2000 | Toyama et al. | 204/192.29 |
| 6,113,732 A | | 9/2000 | Yoshida et al. | 156/345 |
| 6,273,955 B1 | | 8/2001 | Yoshino et al. | 118/718 |

OTHER PUBLICATIONS

"Progress in the Application of the Plasma Emission Monitor in Web Coating" pp. 124–139. S. Schiller, U. Heisig, Chr. Korndorfer, J. Strumpfel, and V. Kirchoff.
JP 11029863 English Abstract.
JP 10092766 English Abstract.

* cited by examiner

*Primary Examiner*—Steven H. VerSteeg
(74) *Attorney, Agent, or Firm*—Fitzpatrick, Cella, Harper & Scinto

(57) ABSTRACT

Since the transfer speed of a substrate is controlled to compensate for a film-forming rate, and an electric power applied to heating means for heating the substrate is controlled so that thermal equilibrium of the substrate is maintained, a film having a uniform thickness and quality can be stably formed even when sputtering is performed for a long time.

10 Claims, 4 Drawing Sheets

SPUTTERING METHOD FOR FORMING FILM AND APPARATUS THEREFOR

BACKGROUND OF THE INVENTION

1. Field of the Invention

The present invention relates to sputtering methods for forming films, and more particularly, relates to a sputtering method for forming a transparent conductive film using a reactive sputtering process such as a DC sputtering process provided with a transfer mechanism.

2. Description of the Related Art

In general, as a sputtering method for forming a transparent conductive film on a substrate, there have been proposed a sputtering method using a target composed of an $In_2O_3$-$SnO_2$-based material in an argon (Ar) atmosphere and a reactive sputtering method using a target composed of an In—Sn alloy in a mixture of Ar and oxygen ($O_2$).

In the former method described above, a film having low electrical resistance and a high transmittance can be obtained immediately after the completion of sputtering; however, it has been difficult to increase the film-forming rate.

In contrast, in the case of the latter method, i.e., in the reactive sputtering method, the film-forming rate can be increased. In particular, in a DC magnetron sputtering apparatus using a cylindrical rotating target disclosed in for example, U.S. Pat. Nos. 4,356,073 and 4,422,916, it has been believed that the usage efficiency of the target material is approximately 2.5 to 3 times that of a conventional planar type target (KINOU ZAIRYO (Functional Material), Vol. 11, No. 3, pp. 35–41, March, 1991).

The high usage efficiency described above means that the cylindrical rotating target described above used for the reactive sputtering method can reduce the cost of target material used and, in addition, can also reduce the apparatus downtime due to target replacement. Accordingly, it is believed that the DC magnetron sputtering apparatus using the rotating target described above can be suitably used as a mass-production apparatus. However, in this reactive sputtering method, since the optimum film-forming conditions, in particular, the optimum gas flow volume, are limited to quite narrow ranges, it has been extremely difficult to properly control the film formation.

As a method which can overcome the disadvantage described above, a reactive sputtering method using a plasma emission monitor (hereinafter referred to as PEM) has been well known, which is disclosed in "Progress in the Application of the Plasma Emission Monitor in Web Coating" by S. Schiller, U. Heisig, Chr. Korndorfer, J, Stumpfel, and V. Kirchhoff (Proceedings of the 2nd. International Conference on Vacuum Web Coating, Fort Lauderdale, Fla., USA, October 1988).

The PEM is a monitoring device for monitoring a plasma state by an electrical signal obtained from plasma emission which is condensed by a collimator and is then photoelectrically transferred by a photomultiplier via a spectroscope. One function of the PEM is to adjust the flow rate of a reactive gas so as to maintain the plasma emission intensity constant while the sensitivity of the photomultiplier is set at a predetermined value. For example, in order to form an ITO (indium tin oxide) film, the PEM controls the flow rate of a reactive gas ($O_2$) So as to maintain the plasma emission intensity of In (wavelength of 451.1 nm) constant, whereby a film having a uniform quality can be obtained.

However, in the case described above in which the PEM is applied to a reactive sputtering process, when a transparent conductive film is continuously formed on a substrate for a long time using a target composed of an In—Sn alloy, the film-forming rate monotonically increases with time.

SUMMARY OF THE INVENTION

The present invention was made to solve the problem described above, and an object of the present invention is to provide an improved film-forming method by sputtering which can stably form a film having uniform thickness and quality on a substrate even when sputtering is performed for a long time.

To this end, a sputtering method for forming a film on a substrate in accordance with one aspect of the present invention comprises a step of controlling a transfer speed of the substrate so as to compensate for the film-forming rate, and a step of controlling the amount of heat applied to the substrate so that thermal equilibrium of the substrate temperature is maintained.

In addition, an apparatus for forming a film on a substrate by sputtering in accordance with another aspect of the present invention comprises a transfer unit for transferring the substrate, a heating unit for heating the substrate, a thickness meter for measuring the thickness of the film formed on the substrate, and a controller for controlling the transfer speed of the substrate and the amount of heat applied to the substrate in accordance with the film thickness measured by the thickness meter, wherein the controller controls the transfer speed to compensate for the film-forming rate and controls the amount of heat applied to the substrate in accordance with the transfer speed so that thermal equilibrium is maintained at a temperature of the substrate.

According to the configuration described above, a film having a uniform thickness and quality can be stably formed on the substrate for a long time.

Further objects, features and advantages of the present invention will become apparent from the following description of the preferred embodiments with reference to the attached drawings.

DESCRIPTION OF THE PREFERRED EMBODIMENTS

In this embodiment according to the present invention, a transparent conductive film having a uniform thickness and quality can be stably formed on a substrate even though reactive sputtering is performed for a long time by using a target composed of a low melting point metal such as an In—Sn alloy. This stable film formation was invented based on the following understandings which were obtained through intensive research by the inventors of the present invention on a DC magnetron sputtering apparatus provided with the cylindrical rotating target described above, and in particular, on a reactive sputtering process using a target composed of an In—Sn alloy.

As a practical example, the case will be described in which photovoltaic elements (nip structure) are formed on a stainless steel sheet used as a continuous substrate, and ITO is then deposited as a topmost transparent conductive film; however, the material for the continuous substrate or the type of element is not limited thereto.

The inventors of the present invention studied the DC magnetron sputtering apparatus provided with the cylindrical rotating target described above, and in particular, the reactive sputtering process using the target composed of an In—Sn alloy.

Figure 4:
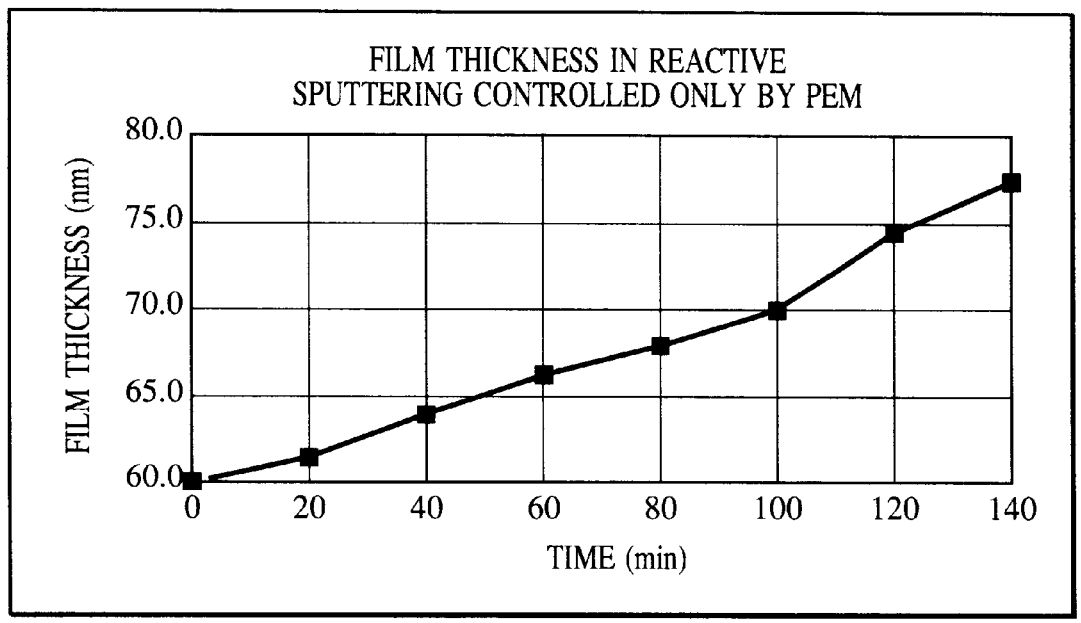
FIG. 4 is a graph showing the thickness of a transparent conductive film formed by reactive sputtering controlled only by a PEM.

First, the transparent conductive film is formed on the continuous substrate using a roll-to-roll sputtering apparatus, which is described below, controlled only by a plasma emission monitor (PEM). This continuous substrate is transferred at a transfer speed of 1.5 m/minute. In the step described above, the film thicknesses indicated by a thickness meter are shown in FIG. 4. As can be seen from FIG. 4, the thickness rapidly increases from the start of the film formation. This means that the film-forming rate rapidly increases, and that only by a PEM the stable film formation cannot be performed.

In view of the phenomenon described above, the inventors of the present invention discovered that even though sputtering is performed for a long time, when the transfer speed control is performed to obtain a uniform film thickness while maintaining the flow rate of oxygen substantially constant (controlled by PEM), a transparent conductive film having a uniform thickness and quality can be stably formed on the substrate. That is, in addition to the control of the transfer speed of the substrate for compensating for the increase in film-forming rate described above, the electric power applied to heating means for heating the substrate is controlled in accordance with the change in transfer speed described above so as to maintain thermal equilibrium of the substrate temperature. By the control described above, even though the sputtering is performed for a long time, a film having a uniform thickness and quality can be stably formed on the substrate.

When the transfer speed is controlled to maintain the film-forming rate constant, a constant sheet resistance of the transparent conductive film can also be obtained. As a result, even when the sputtering is performed over 10 hours, a constant conversion efficiency of a solar battery can be substantially obtained. In addition, when this control method is applied to a reactive sputtering process, where it is generally believed that the film formation control is extremely difficult to perform, the film formation control mentioned above can be easily performed. Hence, the features of the reactive sputtering process, such as a high film-forming rate, a reduction of the cost of a target material used, a decrease in apparatus downtime due to target replacement can be advantageously exploited.

Hereinafter, examples of the present invention will be described; however, the present invention is not limited thereto. In particular, in the examples below, a roll-to-roll sputtering apparatus, which is a reactive sputtering type apparatus, will be described; however, as long as the sputtering apparatus is provided with a transfer mechanism, the present invention can be applied to any sputtering apparatuses regardless of the sputtering method, sputtering system, and the like.

FIRST EXAMPLE

In a sputtering method for film formation of the first example, a control method will be described in which the transfer speed of the substrate is intermittently increased, and when the transfer speed is intermittently increased, the electric power applied to heating means is intermittently increased. In the step described above, a roll-to-roll type reactive sputtering apparatus shown in FIG. 1 provided with a cylindrical rotating target was used.

Figure 1:
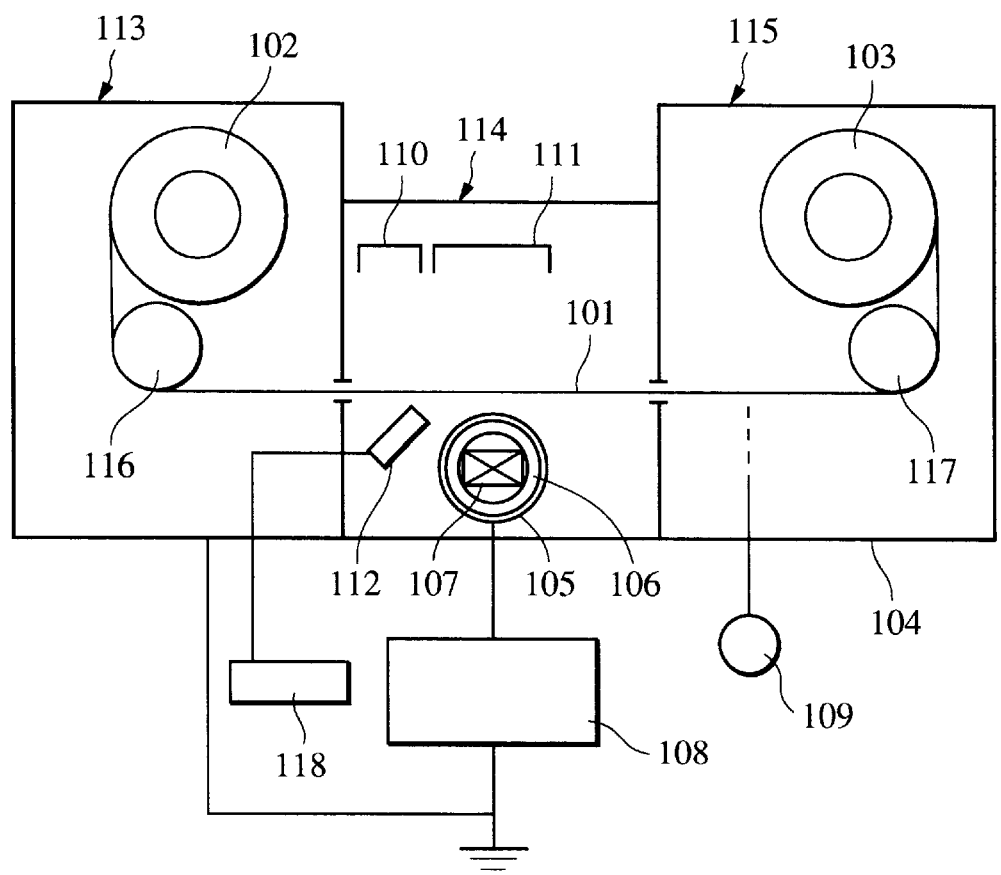
FIG. 1 is a schematic cross-sectional view showing an example of a sputtering apparatus for forming a transparent conductive film according to an embodiment.

As shown in FIG. 1, a vacuum chamber 104 was composed of a substrate-feeding chamber 113, a film-forming chamber 114, and a substrate-winding chamber 115, and these chambers could be evacuated by vacuum pumps (not shown), respectively.

A continuous substrate 101 wound around a substrate-feeding roll 102 was transferred from the left to the right through an idler roller 116 by transferring means (not shown) and was regularly wound around a substrate-winding roll 103 by a steering mechanism 117.

A cathode 106 was cylindrical and a target 105 was bonded to the periphery thereof. Inside the cathode 106, a magnet 107 and cooling means (not shown) were provided. A DC power supply 108 was connected so that the vacuum chamber 104 was used as an anode, and the electric power was applied between the cathode 106 and the vacuum chamber 104. A heater 110 and a heater 111 were sheath heaters. The heater 110 was disposed at a slightly left side from the cathode 106 (at the substrate-feeding roll 102 side), and the heater 111 was disposed over the cathode 106. In addition, the electric capacity of the heater 110 was larger than that of the heater 111. In particular, under the heater 111, the heat of the heaters and the heat of plasma were applied to the continuous substrate 101 from the top and the bottom sides, respectively. Accordingly, a thermocouple was brought into contact with the backside (upper side surface in FIG. 1) of the continuous substrate 101 so as to measure the temperature. Subsequently, the electric power applied to the heaters 110 and 111 was controlled to maintain the temperature constant.

A thickness meter 109 was an optical interference type thickness meter. The apparatus having the configuration described above may be automatically or manually operated; however, in both cases, an interlock mechanism is preferably provided for safety purpose. The apparatus described above was operated in accordance with the following procedure. The substrate-feeding roll 102 having the continuous substrate 101 wound around the roll was first set in the substrate-feeding chamber 113. Next, the continuous substrate 101 set in the substrate-feeding chamber 113 was extended to the substrate-winding chamber 115 via the film-forming chamber 114 and was then fixed on the substrate-winding roll 103, and subsequently, the substrate-winding roll was rotated 2 to 3 times. Tension was then applied to the continuous substrate by a tension-generating mechanism (not shown).

In the case in which the continuous substrate 101 was electrically floating from ground as a conductive substrate (Japanese Unexamined Patent Application Publication No. 10-92766), the floating state thereof was confirmed immediately after the tension was applied thereto. Next, the film-forming chamber 114 was evacuated in the range of $10^{-3}$ Pa by a vacuum pump (not shown). Subsequently, an Ar gas was fed into the chamber so that the pressure 15 inside the film-forming chamber 114 was 0.3 Pa.

In addition, the electric power was applied to the heaters 110 and 111, and the output of the heaters 110 and 111 were controlled so that the temperatures at two points, which were under the two heaters, on the backside of the continuous substrate 101 were 215° C. and 200° C., respectively.

After one hour from the beginning of the application of the electric power to the heaters 110 and 111, an electric power of 1.8 kW was applied to the cathode 106 by the DC power supply 108. Next, when the generation of Ar discharge was confirmed, an $O_2$ gas is fed into the film-forming chamber 114, and the continuous substrate 101 was transferred at a transfer speed of 1.5 m/minute. In addition, in accordance with a method disclosed in Japanese Unexamined Patent Application Publication No. 11-029863, the sensitivity of a photomultiplier of PEM 118 was adjusted.

As the PEM, Plasma Emission Monitor PEM04 (Manufactured by VON ARDENNE ANLAGENTECH-NICK GMBH) or the like may be used. Plasma is conducted by collimator 112 to PEM 118. In order to adjust the sensitivity, only an Ar gas was discharged, and the gain of the photomultiplier was adjusted so that the plasma intensity was 900. After the adjustment was performed, an $O_2$ gas was again fed into the chamber, and the film formation was then started.

When a portion of the substrate on which the film was formed was transferred above the thickness meter 109, the set point of the plasma emission intensity was adjusted so that the thickness meter indicated 60 nm. The transparent conductive film was formed while this adjustment was performed when necessary. When a film having a desired length was formed on the continuous substrate 101, the feed of the $O_2$ gas and the Ar gas, and the electric power application to the DC power supply 108, the heater 110, and the heater 111 were all stopped. In addition, after the transfer of the substrate was stopped and was then spontaneously cooled for 1 hour, the vacuum chamber 104 was exposed to air, and the product was then taken out therefrom.

Hereinafter, this example will be described with reference to FIGS. 2A to 2E.

Figure 2A:
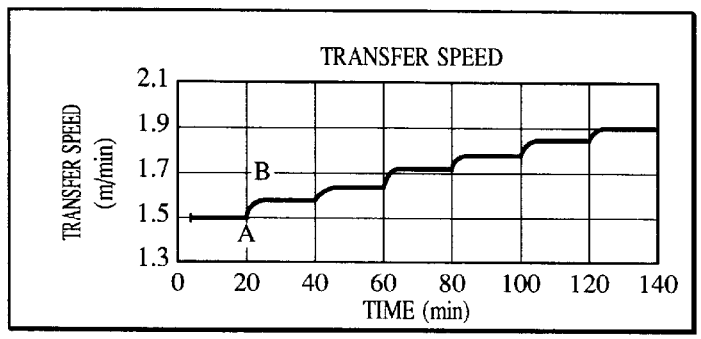
FIG. 2A is a graph showing the relationship between the transfer speed of a substrate and the lapse of time for illustrating a method for forming a transparent conductive film with transfer speed control according to a first example.
Figure 2B:
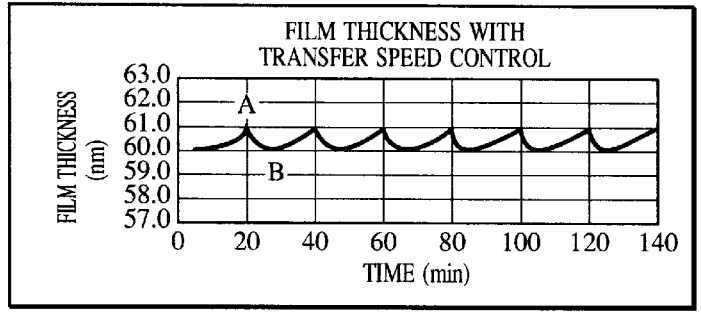
FIG. 2B is a graph showing the film thickness with the lapse of time according to the first example.
Figure 2C:
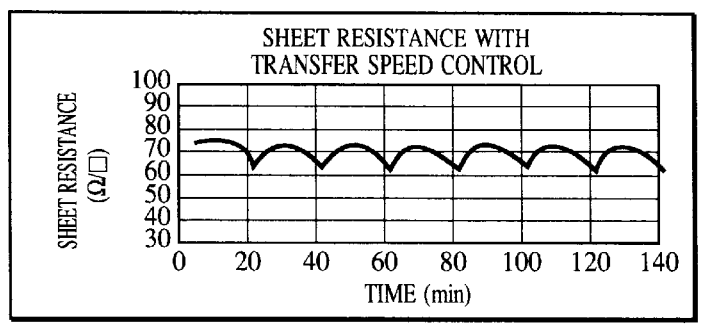
FIG. 2C is a graph showing the sheet resistance with the lapse of time according to the first example.
Figure 2D:
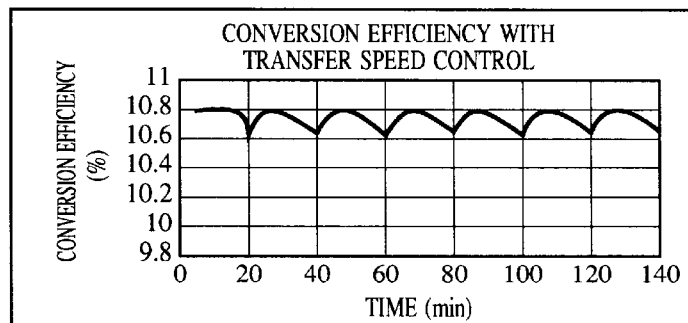
FIG. 2D is a graph showing the conversion efficiency with the lapse of time according to the first example.
Figure 2E:
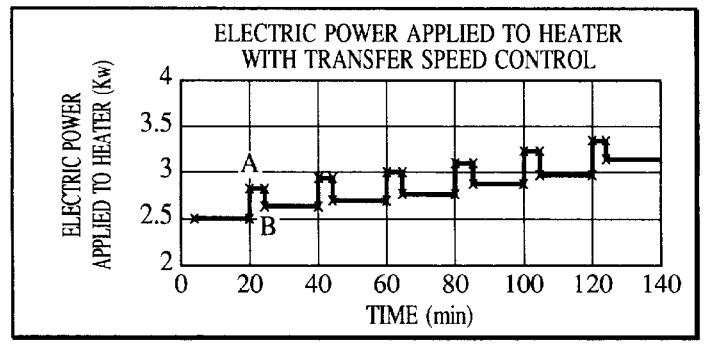
FIG. 2E is a graph showing the electric power applied to a heater with the lapse of time according to the first example.

FIG. 2A shows the transfer speed of the substrate with time, FIG. 2B shows the film thickness measured by the thickness meter 109 with time, FIG. 2C shows the sheet resistance with time, FIG. 2D is the conversion efficiency with time, and FIG. 2E shows the electric power applied to the heater, which is the heating mean for the substrate, with time.

The transfer speed control of the substrate was performed in accordance with the film thickness measured by the thickness meter 109. In particular, when the point A was detected at which a predetermined thickness of 60 nm was increased by 1 nm, the transfer speed was increased by 0.08 m/minute. The change of the transfer speed is shown in FIG. 2A by the line extending between the point A and the point B.

As can be seen from FIG. 2A, 3 minutes was required for the change from the point A to the point B. The change from the point A to the point B could not be instantaneously performed. The reason for that is that the initial weight of the substrate-feeding roll was approximately 1 ton. Due to the change described above, as shown in FIG. 2, the thickness was decreased to a thickness at the point B, i.e., the thickness was decreased to 60 nm. Subsequently, since the thickness was gradually increased as shown in FIG. 2B, the change in transfer speed was again performed in a manner as described above when the thickness was increased by 1 nm. Even though the thickness data varied in practice, in order to facilitate understanding, the data averaged is shown in FIG. 2B. The reason the thicknesses varied was that when the steering roll 117 was activated, the continuous substrate 101 was twisted. When the steps described above were repeated, the results shown in FIGS. 2A to 2B were obtained.

Sheet resistance of approximately 65 to 75 Ω (see FIG. 2C) and conversion efficiency of approximately 10.6 to 10.8% (see FIG. 2D) were obtained. While the change from the point A to the point B occurred, thermal equilibrium could not be maintained since the amount of the effective heat applied to the continuous substrate 101 was decreased.

Accordingly, the amount of an electric power to be applied to the substrate was experimentally studied beforehand. In this controlling method, the electric power applied to the heater at the point A was increased by approximately 0.3 kW, and the electric power applied to the heater just before the point B, at which the thickness was a predetermined value of 60 nm, was set to 2.6 kW (decrease of approximately 0.2 kW), whereby a film having a uniform quality can be obtained.

In addition, as shown in FIG. 2E, the electric power intermittently applied to the heater had a rectangular shape; however, when the electric capacity of the heater was enough, and thermal equilibrium could be obtained in a short time, the electric power might have an optional shape, such as a triangular shape. The heater described above means the heater 110; however, when the electric capacity of the heater 110 was not enough, and thermal equilibrium could not be obtained in a short time, the heater 111 might be simultaneously operated.

SECOND EXAMPLE

In a sputtering method for film formation of a second example, a controlling method was employed in which the transfer speed of a substrate was continuously increased, and the electric power applied to heating means was increased so that the increasing pattern thereof was analogous to that of the transfer speed of the substrate. In the step described above, the roll-to-roll type sputtering apparatus shown in FIG. 1 described in the first example was used.

Hereinafter, this example will be described with reference to FIGS. 3A to 3E.

Figure 3A:
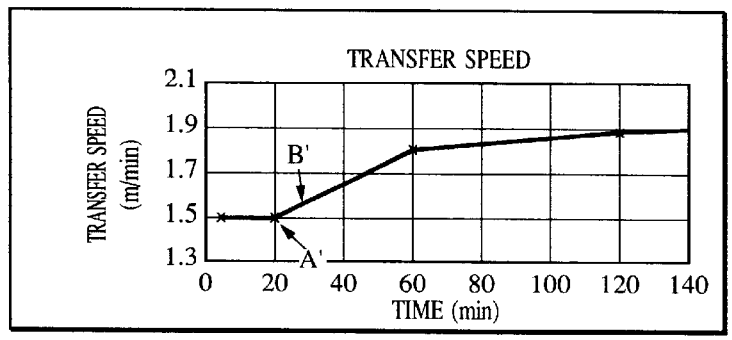
FIG. 3A is a graph showing the relationship between the transfer speed of a substrate and the lapse of time for illustrating a method for forming a transparent conductive film with transfer speed control according to a second example.
Figure 3B:
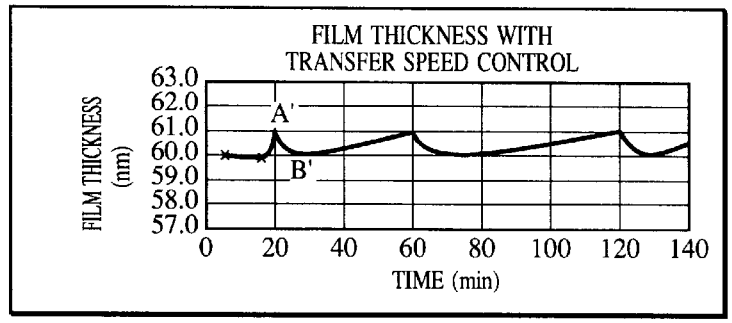
FIG. 3B is a graph showing the film thickness with the lapse of time according to the second example.
Figure 3C:
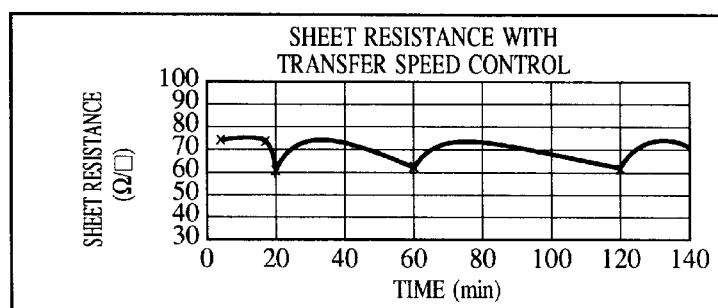
FIG. 3C is a graph showing the sheet resistance with the lapse of time according to the second example.
Figure 3D:
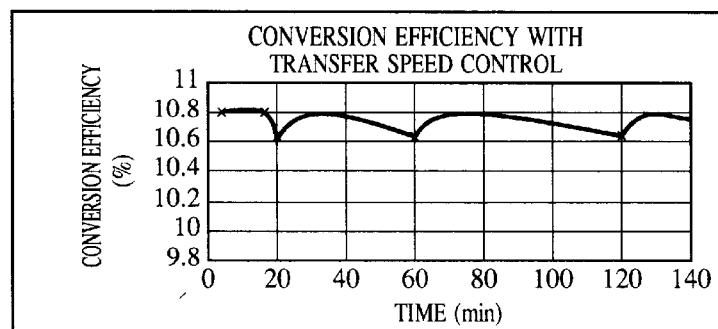
FIG. 3D is a graph showing the conversion efficiency with the lapse of time according to the second example.
Figure 3E:
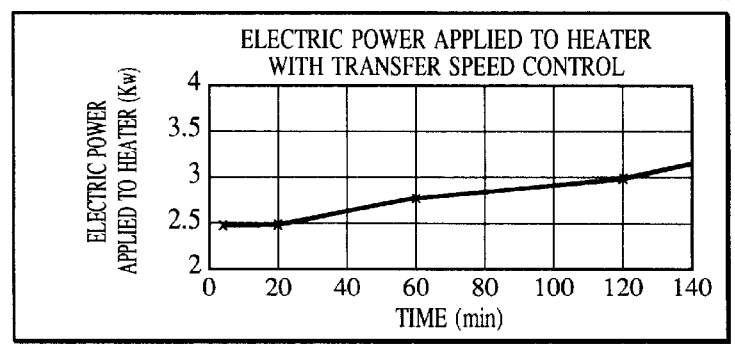
FIG. 3E is a graph showing the electric power applied to a heater with the lapse of time according to the second example.

FIG. 3A shows the transfer speed of the substrate with time, FIG. 3B shows the film thickness measured by a thickness meter 109 with time, FIG. 3C shows the sheet resistance with time, FIG. 3D is the conversion efficiency with time, and FIG. 3E shows the electric power applied to the heater, which is the heating mean for the substrate, with time.

As shown in FIG. 3B, the film thickness was rapidly increased immediately after the film formation started.

When a predetermined film thickness of 60 nm was increased by 1 nm (point A') as shown in FIG. 3B, the transfer speed was increased by 0.075 m/minute from a period of 20 minutes to 60 minutes and was increased by 0.033 m/minute from a period of 60 to 120 minutes as shown in FIG. 3A. As a result, the thickness was decreased to a thickness indicated by the point B'. The results obtained by repeating the adjustment described above are shown in FIGS. 3A to 3E. Accordingly, as can be seen in FIG. 3C, the sheet resistance with the transfer speed control was approximately 65 to 75 Ω, and the conversion efficiency shown in FIG. 3D was approximately 10.6 to 10.8%, whereby a film having a stable quality could be obtained.

In addition, in accordance with the increase of the transfer speed, the electric power applied to the heater was continuously increased so as to compensate for insufficient heat thereof applied to the continuous substrate caused by continuous control of the transfer speed. Since this insufficient heat of the heater became apparent when the rate of the change in transfer speed was increased, the graph shown in FIG. 3A became analogous to that shown in FIG. 3E. In this example, the result shown in FIG. 4 was obtained when the inside diameter of a target 105 was 200 mm, a temperature of cooling means provided in a cathode 106 was 18° C., and the flow rate of circulated cooling water was 30 liter/minute; however, in accordance with the change in inside diameter of the target, and temperature and flow rate of the cooling water, the slope of the change in film-forming rate may also vary. In the case mentioned above, the adjustment may be optionally performed in accordance with the method described above.

As has thus been described, according to the present invention, the transfer speed of the substrate is controlled so as to compensate for the film-forming rate, and in addition, the electric power applied to the heating means for the substrate is controlled so that thermal equilibrium at the temperature of the substrate is maintained even when the transfer speed is changed. Consequently, although sputtering is performed for a long time, a film-forming method by sputtering for stably forming a film having a uniform thickness and quality can be obtained.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for forming a film by sputtering on a substrate, comprising:

a step of controlling a transfer speed of the substrate so as to compensate for a film-forming rate while sputtering;

a step of controlling an electric power applied to a heating unit to control the amount of heat applied to the substrate in accordance with the change in transfer speed; and a step of controlling the transfer speed of the substrate to intermittently increase by (i) controlling the electric power to a constant P1 while the transfer speed is V1, (ii) controlling the electric power to be P2 when the transfer speed is increasing, wherein P2>P1; and (iii) controlling the electric power to be a constant P3 when the transfer speed reaches V2, wherein V2>V1 and P2>P3>P1.

2. The method according to claim 1, further comprising a step of measuring the thickness of the film formed on the substrate, wherein, when the film equals or exceeds a predetermined thickness, the transfer speed of the substrate is increased, and the electric power applied to the heating unit is increased.

3. The method according to claim 1, wherein the transfer speed is intermittently increased, and the electric power applied to the heating unit is intermittently increased in accordance with the intermittent increase of the transfer speed.

4. The method according to claim 1, wherein the film formed on the substrate is a transparent conductive film.

5. The method according to claim 1, wherein the sputtering is reactive sputtering.

6. The method according to claim 5, wherein the reactive sputtering is reactive sputtering using a plasma emission monitor.

7. The method according to claim 1, wherein the substrate is a strip-shaped substrate, and the film formation is performed on the strip-shaped substrate while the substrate is continuously transferred.

8. An apparatus for forming a film by sputtering on a substrate, comprising:

a transfer unit for transferring the substrate;

a heating unit for the substrate;

a thickness meter for measuring the thickness of the film formed on the substrate; and a controller for coordinating the transfer speed of the substrate and the amount of heat generated by the heating unit in accordance with the measured film thickness by controlling an electric power applied to the heating unit;

wherein the controller controls the transfer speed so as to compensate for the film-forming rate during sputtering, and controls the amount of heat generated by the heating unit in accordance with the transfer speed, wherein the controller controls the transfer speed to provide an intermittently increasing pattern by (i) controlling the electric power to a constant P1 while the transfer speed is V1, (ii) controlling the electric power to be P2 when the transfer speed is increasing, wherein P2>P1; and (iii) controlling the electric power to be a constant P3 when the transfer speed reaches V2, wherein V2>V1 and P2>P3>P1.

9. The apparatus according to claim 8, wherein, when the film formed on the substrate equals or exceeds a predetermined thickness, the controller increases the transfer speed of the substrate and the electric power applied to the heating unit.

10. The apparatus according to claim 9, wherein the controller intermittently increases the transfer speed of the substrate and intermittently increases the electric power applied to the heating unit in accordance with the intermittent increase of the transfer speed.

* * * * *